United States Patent
Watanabe et al.

(10) Patent No.: US 6,771,324 B1
(45) Date of Patent: Aug. 3, 2004

(54) DISPLAY AND APPARATUS

(75) Inventors: Toshimitsu Watanabe, Yokohama (JP); Kuninori Matsumi, Yokohama (JP); Tomoharu Nakiri, Yokohama (JP)

(73) Assignees: Hitachi, Ltd., Tokyo (JP); Hitachi Video and Information Systems, Inc., Yokohama (JP)

( * ) Notice: Subject to any disclaimer, the term of this patent is extended or adjusted under 35 U.S.C. 154(b) by 0 days.

(21) Appl. No.: 09/622,565
(22) PCT Filed: Aug. 28, 1998
(86) PCT No.: PCT/JP98/03845
§ 371 (c)(1), (2), (4) Date: Aug. 18, 2000
(87) PCT Pub. No.: WO99/49652
PCT Pub. Date: Sep. 30, 1999

(30) Foreign Application Priority Data

Mar. 26, 1998 (JP) .......................... 10-078824

(51) Int. Cl.[7] ............................... H04N 5/44
(52) U.S. Cl. ..................... 348/734; 348/563; 348/569
(58) Field of Search ................. 348/734, 563, 348/564, 565, 569; 340/825.52, 82.72; H04N 9/00, 5/00, 5/44, 5/445

(56) References Cited

U.S. PATENT DOCUMENTS

| | | | | |
|---|---|---|---|---|
| 5,436,676 A | * | 7/1995 | Pint et al. | 348/734 |
| 5,675,395 A | * | 10/1997 | Martin et al. | 348/734 |
| 5,737,107 A | * | 4/1998 | Umeda | 340/825.52 |
| 5,870,380 A | * | 2/1999 | Diehl et al. | 348/734 |

FOREIGN PATENT DOCUMENTS

| | | | |
|---|---|---|---|
| JP | 2-96497 | 4/1990 | |
| JP | 3-46465 | 2/1991 | |
| JP | 3-183266 | 8/1991 | |
| JP | 3-184433 | 8/1991 | |
| JP | 4-130861 | 5/1992 | |
| JP | 05122781 | 5/1993 | |
| JP | 06-181589 | * 6/1994 | H04N/5/00 |
| JP | 06181589 | 6/1994 | |
| JP | 06-319059 | * 11/1994 | H04N/5/00 |
| JP | 07099689 | 4/1995 | |
| JP | 07-099689 | * 4/1995 | H04N/9/00 |
| JP | 09065262 | 3/1997 | |
| JP | 09130884 | 5/1997 | |

* cited by examiner

Primary Examiner—Michael H. Lee
Assistant Examiner—Trang U. Tran
(74) Attorney, Agent, or Firm—Townsend and Townsend and Crew LLP

(57) ABSTRACT

It is an object of the present invention to provide equipment, particularly a display, capable of easily corresponding to two or more types of remote controllers (for example, remote controllers of different manufacturers) while restraining cost increases as far as possible.

Equipment according to the present invention comprises: initializing means for initializing so as to correspond to any one of plural types of remote controllers; and switching means for switching the initializing means so as to correspond to the remote controller using any one of the plural types of remote controllers. Thereby, the equipment is initialized so as to correspond to any one of the plurality of remote controllers, and it is possible to prevent misoperation due to other remote controllers. Also, by switching the initializing means by using any remote controller, switching can be performed if only a desired remote controller is available.

8 Claims, 7 Drawing Sheets

Display 47
IR:A company

Audio generator 63
Display panel 62
VTR 64

DISPLAY AND APPARATUS

TECHNICAL FIELD

The present invention relates to equipment capable of remote control using plural types of remote controllers (hereinafter, abbreviated to remote controllers) for transmitting signals modulated through, for example, infrared-rays or the like, and more particularly, to a display capable of remote control in response to each of plural types of remote controllers manufactured by different manufacturers.

BACKGROUND ART

In recent years, displays such as computer monitors and television receiving sets have been developed in larger scale in order to cope with the trend toward higher performance and digitizing of broadcasting, and two or more manufacturers may develop in cooperation. In such a case, display sets of different brands generally use their respective corresponding remote controllers to avoid misoperation in over-the-counter display or the like. In view of circumstances of maintenance and various adjusting operations, however, a display set of a certain brand can be preferably used in common through a remote controller of different brand. In order to cope with this, for example, the following methods are generally used:

(1) The display sets have the same structure, and microcomputers having ROMs which are different in program portion for analyzing the code of an infrared remote controller are prepared for each brand, and display sets with different microcomputers mounted are used.

(2) Microcomputers are mounted with program portions for analyzing the code of the infrared remote controller for plural brands, and initialization of these microcomputers is fixed for each brand prior to shipment. As the fixing method, there are the following methods:

(a) Hardware initializing method such as switching of a voltage value given to the input port of the microcomputer.

(b) Software initializing method for designating a usage range or the like for the code analysis unit to the microcomputer.

In the case of using the method (1) described above, it is necessary to prepare a different microcomputer for each brand, and there is a problem that cost increases cannot be avoided. Also, in the case of (2) (a), there is a problem of cost increases caused by change in pattern or the like for the substrate for mounting a microcomputer for each brand and addition of an Input/Output port. Also, in the case of (2) (b), it is named as a problem that in order to initialize the data, there is a need to initialize at production line and to take countermeasures to latch-up of microcomputers caused by discharge or the like within the television sets. Further, in either method (1) or (2), there is the cumbersomeness that remote controllers corresponding to each brand must be prepared during service adjustment for performing adjustment such as repair in the market, and it is also a problem to eliminate the cumbersomeness.

Also, aside from each method described above, there is also known a method, as described in, for example, Japanese Patent Laid-Open Application No.7-99689, in which a selection instructing signal is transmitted to thereby allow two types of remote controllers to correspond respectively. However, this method has a problem that a remote controller which is capable of reception must be used to transmit a selection instructing signal, and without this remote controller, it is not possible to switch to a desired remote controller.

Also, as described in Japanese Patent Laid-Open Application No.4-245895, there is known a method in which it is an object to construct a control system using remote controllers by simply connecting between control equipment in which plural equipment are made controllable through a remote control signal received and other equipment. However, this method has a problem that only a specified remote controller can operate the control equipment, remote control signals from other remote controllers are transferred to other equipment, and are not capable of controlling the control equipment.

The present invention has been achieved in the light of the above-described problems, and is aimed to provide such equipment, particularly a display as to be able to easily correspond to two or more types of remote controllers (for example, remote controllers manufactured by plural manufacturers) with restraining cost as far as possible.

DISCLOSURE OF THE INVENTION

In order to achieve the above-described object, a display which is operable by plural types of remote controllers according to the present invention is characterized by the following structure. The display comprises: a display portion; switching means for switching so as to be operated by any one of the plural types of remote controllers; and displaying means for displaying, on the display portion, the switching information on switching in the switching means.

Also, the switching information is characterized by the fact that it is information indicating the types of the remote controllers, for example, information indicating the brand or manufacturer of the remote controller.

Also, the switching means is characterized by the fact that it switches on the basis of a transmission signal from the remote controller.

Also, the display is characterized by the fact that it has selecting means for determining whether or not the switching of the switching means is permitted and the switching means is adapted to be switchable only when the selecting means has given the permission. The selecting means is provided so that it is not exposed from the outer surface portion of the display.

Also, the selecting means is characterized by the fact that it is used also as adjusting means used when the display is adjusted. The adjustment is characterized by being performed using the remote controller. Also, the adjustment is characterized by the fact that it is convergence adjustment.

Also, the display comprises audio signal generating means for notifying by voice that the switching has been performed by the switching means.

Also, the display is characterized by the fact that it is a television set.

Or, in order to achieve the object, equipment according to the present invention adopts the following structure. The equipment comprises: initializing means for initializing so that it can be operated by any one of plural types of remote controllers; and switching means for switching the initializing means, so that the equipment can be operated by an arbitrary remote controller of the plural types of remote controllers, by using the arbitrary remote controller.

Or, the following structure is adopted. The display is characterized by the fact that it has at least a first mode in which the operation is performed in response to a command contained in a transmission signal from a first remote controller, and a second mode in which the operation is performed in response to a command contained in a transmission signal from a second remote controller, and that on the basis of the transmission signal received, either the first or second mode corresponding to the first or second remote controller which has transmitted the transmission signal is made initializable.

Also, the display is characterized by the fact that it comprises: a photoreceptor device for receiving a transmission signal from a remote controller to convert it into an electric signal; and control means for controlling, on the basis of an electric signal converted by the photoreceptor device, so that a command contained in the electric signal is executed, that the control means is provided with a first control mode in which control is performed in response to a command contained in a transmission signal from the first remote controller, and a second control mode in which control is performed in response to a command contained in a transmission signal from the second remote controller, and on the basis of the transmission signal received, it is distinguished whether the remote controller which has transmitted the transmission signal is either the first or second remote controller, and that in response to the discrimination result, either the first or second control mode is made initializable.

The above-described mode may be initialized on the basis of a ID code signal representing the type (manufacturer) of the remote controller contained in a transmission signal from the remote controller, for example, a header signal. Also, it is preferable to further provide the above-described structure with selecting means so that the above-described mode can be initialized only when the selecting means is in the ON condition.

Also, if the above-described equipment is a display, it may be possible to display the discrimination result of the remote controller by the control means on a screen.

Further, it may be possible to constitute the control means by at least first and second microcomputers which have different control objects from each other, to discriminate the remote controller by the first microcomputer, and to initialize the control mode of the first and second microcomputers in response to the result.

Further, it may be possible to control video signal processing means for processing a video signal inputted by the first microcomputer, to control synchronous signal processing means for processing a synchronous signal inputted by the second microcomputer, and to connect the first and second microcomputers together through a bus for transmitting and receiving information containing the discrimination result of the remote controller.

Further, it may be possible to exert, using the first microcomputer, control for convergence correction and control for displaying the discrimination result of the remote controller on a screen, to exert, using the second microcomputer, control for converting a video signal digitized into an analog video signal, and to connect the first and second microcomputers together through a bus for transmitting and receiving information containing the discrimination result of the remote controller.

Further, it may be possible to connect the selecting means for initializing the mode to the first microcomputer so that the first microcomputer discriminates the remote controller when the selecting means is in the ON condition.

The above-described structure has the following effect. By initializing so that the display corresponds to any one of the remote controllers using the above-described initializing means, it is possible to prevent wrong operation due to other remote controllers. Also, by switching the initializing means by using any remote controller, switching can be performed if only a desired remote controller is available.

Also, the display of the above-described switching information on a display portion enables the user to know that the switching has been performed. The display of the type of the remote controller such as, for example, the brand or manufacturer enables the user to know that the switching has been performed to correspond to which remote controller.

Also, if the switching is performed on the basis of a transmission signal from the remote controller, the switching can be performed by the remote controller itself.

Also, if it is made switchable only when the selecting means is in the ON condition, it will be possible to prevent erroneous switching. Also, with the provision of the selecting means within the display, it is possible to prevent the selecting means from being erroneously turned on. Also, the selecting means is used also as the adjusting means to thereby restrain cost increases.

Also, by adjusting using a remote controller, it is possible to adjust the display at a distance therefrom. Particularly, on performing convergence adjustment, it is necessary to adjust it while viewing the entire display portion at a distance from the display, and therefore, the user's usability is improved by adjusting using the remote controller.

Also, with the provision of the audio signal generating means, the user can know that the switching has been performed even with equipment without any display portion or a display with a small display portion.

Also, if the control modes of the first and second microcomputers are initialized in response to the discrimination result of the remote controller in the first microcomputer, a program for discrimination can be stored in any one of the plurality of microcomputers in advance.

BEST MODE FOR CARRYING OUT THE INVENTION

Hereinafter, with reference to the drawings, the description will be made of embodiments according to the present invention.

Figure 1:
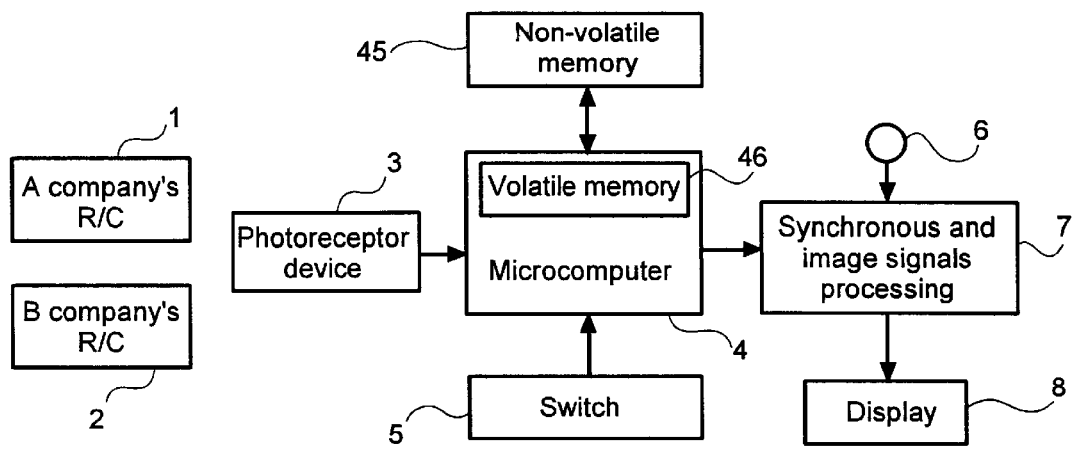
FIG. 1 is a block diagram showing a first embodiment of display according to the present invention.

First, the first embodiment according to the present invention will be described with reference to FIGS. 1 to 6. FIG. 1 is a block diagram showing a display to which the present invention is applied. This display comprises an infrared code signal (hereinafter, abbreviated to R/C signal) transmitter 1 of A company, a R/C transmitter 2 of B company, a photoreceptor device 3, a microcomputer 4, a switch 5, a video signal input terminal 6, a synchronous and video signals processing block 7, a display portion 8, and a non-volatile memory 45 represented by EEPROM and EPROM. Also, the microcomputer 4 has a volatile memory 46 represented by SRAM or DRAM.

Figure 2:
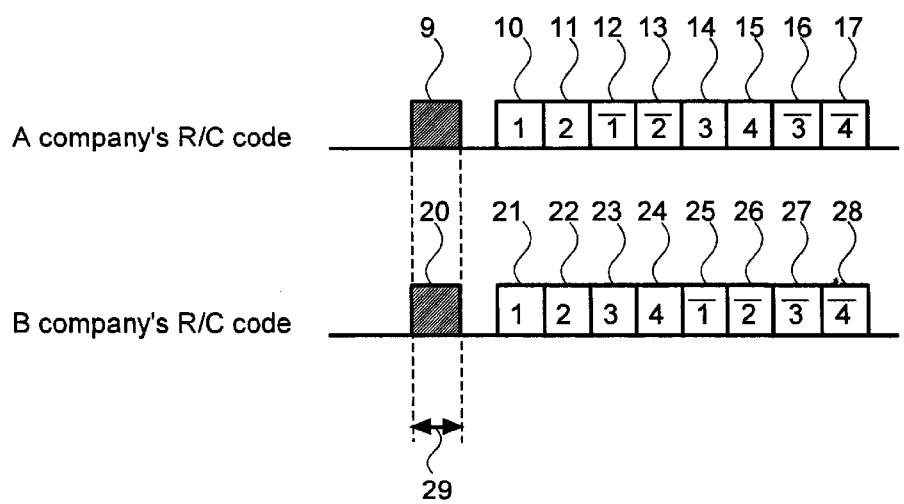
FIG. 2 is a view showing an example of forms of transmission signals outputted from the remote controller.

To begin with, the description will be made of the basic operation when a display which has been initialized so as to correspond to the A company's R/C transmitter 1 prior to shipment, and in whose non-volatile memory 45 the initialization has been stored is operated using the A company's R/C transmitter 1. A R/C signal transmitted from the A company's R/C transmitter 1 is modulated by a carrier signal of about several tens kHz. The content of the signal is generally composed of a header signal 9, code signals of 1 byte 10, 11, 14 and 15, and reversed signals 12, 13, 16 and 17 as shown in FIG. 2. When it is inputted to the photoreceptor device 3, a modulated signal is converted into an electric signal and is inputted to the microcomputer 4. The microcomputer 4 analyzes a header signal 9 to recognize the modulated carrier frequency. Then, it analyzes the subsequent data 10 to 17 with the carrier frequency as a reference to determine the code of four bytes. If the code of four bytes is, for example, instruction information to increase the contrast, the video signal inputted from the terminal 6 is controlled by a signal processor 7 so as to increase the signal amplitude on the basis of this code, and the operation is caused to be performed so as to improve the contrast of the pattern displayed on the display portion 8.

The description will be made of how to perform service adjustment of the display using the B company's R/C transmitter 2. The content of the B company's R/C signal is composed of a header signal 20 having a different carrier frequency, and repetition of code signals of one byte 21 to 24 and reversed signals 25 to 28 as shown in FIG. 2. Since this signal is different from the A company's R/C signal in format, they are different from each other in array of code signal and reversed signal. For this reason, when it is transmitted without changing the initialization, the B company's R/C signal is judged to be noise by the microcomputer 4, and cannot control the signal processor 7.

Figure 3:
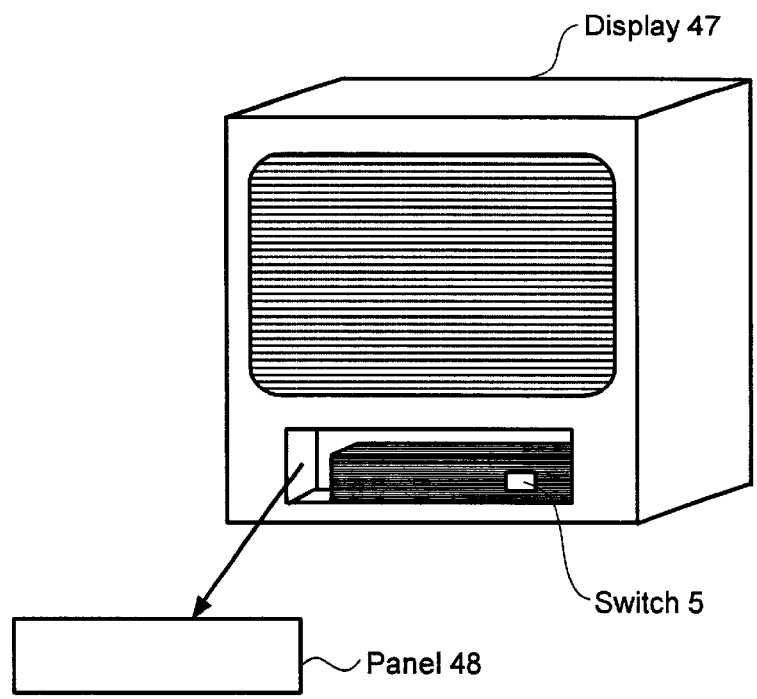
FIG. 3 is a view showing a display equipped with a switch therein.
Figure 4:
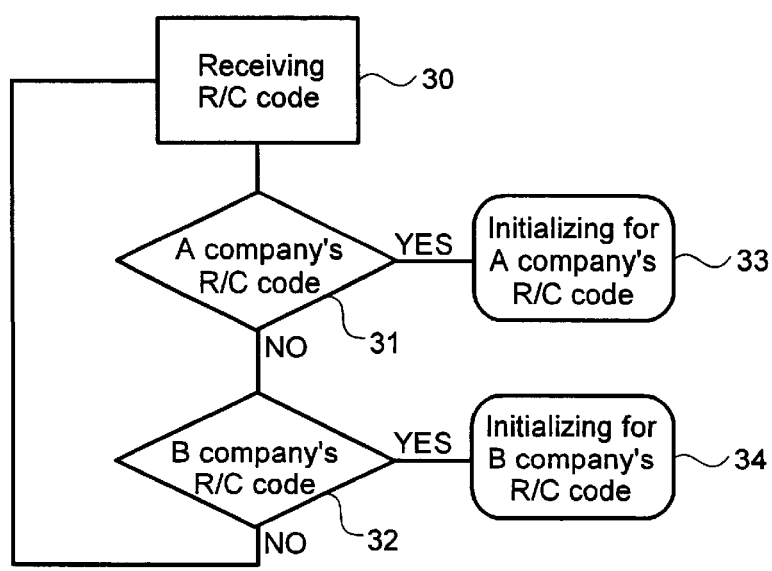
FIG. 4 is a flowchart representing the operation of the first embodiment shown in FIG. 1.

In order to cause such a display to correspond to a signal from the B company's R/C transmitter 2, a panel 48 on the front of the display 47 is first removed as shown in FIG. 3, and the switch 5 located therein is turned on. The switch 5 is connected to the microcomputer 4, and is used to start the software having the algorithm described in the flowchart shown in FIG. 4. The content of the flowchart of FIG. 4 will be described below. A signal transmitted from the B company's R/C transmitter 2 is received by the photoreceptor device 3, and after converted into an electric signal, it is subjected to signal analysis including the header signal in the microcomputer 4. When the reception is recognized by a R/C code receiving block 30, a determination block 31 for the A company's R/C code determines it. If this result is NO, the sequence proceeds to the next step to determine by a determination block 32 for the B company's R/C code. If the determination result of this determination block 32 is YES, the internal program of the microcomputer 4 is initialized so as to correspond to the B company's R/C code in the B company's R/C code initializing block 34. This initialization enables the microcomputer 4 to interpret code information transmitted from the B company's R/C transmitter 2. Thereafter, the switch 5 is turned off to thereby store the B company's R/C code initialization in a volatile memory 46, and to identify the transmission signal from the A company's R/C transmitter 1 as noise.

In this way, the display initialized to the A company's R/C transmitter 1 can be adjusted using the B company's R/C transmitter 2. Since the initialization of B company's R/C code has been stored in the volatile memory 46, what has been stored in the volatile memory 46 is erased by turning off the power supply. Therefore, the next time the power supply is turned on, the initialization is made to the A company's R/C code stored in the non-volatile memory 45, and it is possible to automatically return to the original code.

Incidentally, it is also possible to change the A company's R/C code stored in the non-volatile memory 45 into the B company's R/C code. First, the switch 5 is turned on, and after initialized to the B company's R/C code, an "instruction to change the initial R/C code" is transmitted using the B company's R/C transmitter 2. On receipt of the "instruction to change the initial R/C code", the microcomputer 4 erases the A company's R/C code stored in the non-volatile memory 45, and writes the B company's R/C code instead. In this way, the R/C code stored in the non-volatile memory 45 can be changed. In order to cause it to correspond to the A company's R/C transmitter 1 again, the same operation is performed.

In this embodiment, the display is not initialized to correspond to both A company's and B company's R/C codes, but initialized to correspond to either. Therefore, even when two displays of A company are adjusted at the same time, one of the displays is initialized to the B company's R/C code whereby it is possible to prevent the display from misoperation during the adjustment. Also, in the case of over-the-counter demonstration in which both A company's and B company's displays are on display, it is possible to prevent the display from misoperation by the initialization to one.

Incidentally, other determination blocks may be provided in addition to the determination blocks 31 and 32 within the microcomputer 4, and in this case, it is possible to correspond to R/C transmitters for other companies than A company and B company.

Figure 5:
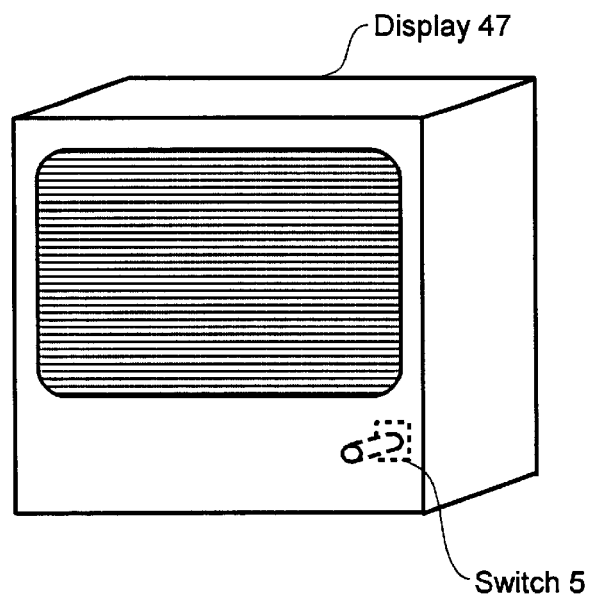
FIG. 5 is a view showing a display equipped with a switch on the front.

In this embodiment, the remote controllers for use are changed in order to perform service adjustment. For this reason, the switch 5 is provided within the display so that a general user does not erroneously switch the initialization. However, if the user desires to optionally use plural brand remote controllers, or if the user desires to adjust without opening the panel of the display, the switch 5 may be provided on the front of the display 47 as shown in FIG. 5. In the case, such a switch as to be pressed using a narrow piece of rod or the like as shown in FIG. 5 can be used to prevent accidental actuation.

Next, the detailed description will be made of determination of the R/C code in the determination blocks 31 and 32. First, the operation of the determination block 31 will be described. The determination block 31 determines the A company's R/C code in accordance with the following steps.
(1) To begin with, the pattern for a header signal will be analyzed. The header signal is information indicating differences in received signal level of the R/C signal for judging whether or not the R/C signal could be correctly received, and whether or not the R/C signal is noise such as external light. The pattern is compared with the pattern of the A company's header signal stored in the ROM within the microcomputer 4 in advance. If it coincides with the stored pattern, it is regarded as a signal as specified and the code signal succeeding to the header signal will be analyzed.
(2) As the result of analysis of the code signal, if the array of the code signal is the same as the array of the A company's code signal (for example, the array indicated by the upper waveform in FIG. 2) stored in the ROM within the microcomputer 4 in advance, the R/C signal is identified as the R/C signal transmitted from the A company's R/C transmitter, and the determination result becomes YES.
(3) If the pattern of the header signal is different or if the code signal is not of the A company, the determination result becomes NO, and the sequence proceeds to the determination block 32.

Next, the operation of the determination block 32 will be described. The determination block 32 determines the B company's R/C code in accordance with the following steps.
(1) The threshold level is controlled in response to the intensity of the header signal.
(2) A threshold level for analyzing the code signal succeeding to the header signal is initialized in response to this controlled threshold level. The analysis is performed by the same method as described concerning the determination block 31, and the array of the code signal inputted is compared with the array (for example, the array indicated by the lower waveform in FIG. 2) stored in the ROM within the microcomputer 4 in advance. If the two are the same, the R/C signal is identified as a R/C signal transmitted from the B company's R/C transmitter, and the determination result becomes YES.
(3) If the determination result is NO, the sequence returns to the R/C code receiving block 30.

In the embodiment, in order to discriminate whether or not the R/C signal received is the A company's R/C signal, there was used a method for discriminating by comparing the pattern of the header signal with the pattern stored, and comparing the array pattern of the code signal and the reversed signal with the array pattern stored. Also, in order to discriminate whether or not it is the B company's R/C signal, there was used a method for discriminating by initializing the threshold level in response to the evaluation of the header signal level and comparing the array pattern of the code signal and reversed signal with the array pattern stored. However, the algorithm of the software according to the present invention does not limit the method for utilizing the header signal and code signal. Also, determination may be performed using the determination blocks 31 and 32 in accordance with the same determination method. For example, if a brand signal corresponding to each brand is contained in code signals transmitted from all R/C transmitters, the brand signals are compared by each determination block whereby it is possible to determine which brand of R/C transmitter it is.

Figure 6:
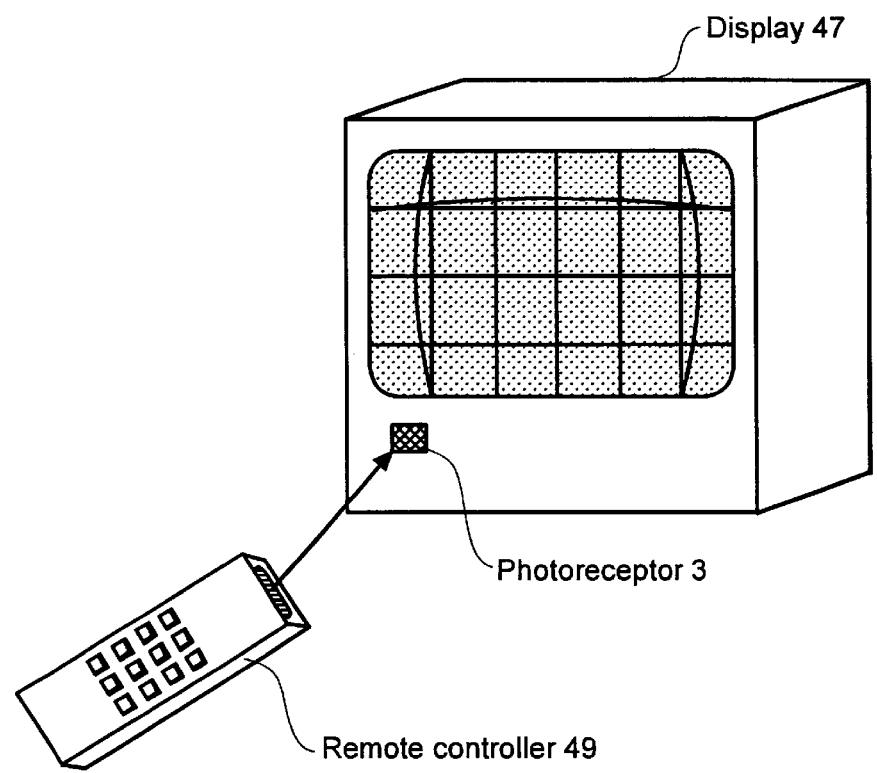
FIG. 6 is a view showing the positions of the remote controller and the display on performing convergence correction.

According to this embodiment, the user's usability can be improved because the remote controller which the equipment accepts can be changed using a desired remote controller by the determination of a R/C signal transmitted from the remote controller. In the case of performing convergence correction or the like particularly with a large display exceeding 40 inch as shown in FIG. 6, it is necessary to adjust using the remote controller 49 while viewing the entire screen at a distance from the display 47, and therefore, it is possible to smoothly move to an adjusting operation if the remote controller for use can be changed by the remote controller 49 itself. The adjustment can be more easily performed when operating with a remote controller than with a button or the like provided on a display, and this is not confined to the convergence correction.

Incidentally, in a display according to this embodiment, it doesn't matter whether or not there is a tuner, whether it is a projection display or a direct view display, and whether it is a liquid crystal display or a Braun tube type display.

Incidentally, in the first embodiment, the present invention has been applied to a display, but it is not limited to the display, but may be applied to all devices using remote controllers such as VTRs, CDs (compact discs), DVDs (Digital Versatile Discs) and air conditioners, which are capable of remote control with a remote controller.

Figure 7:
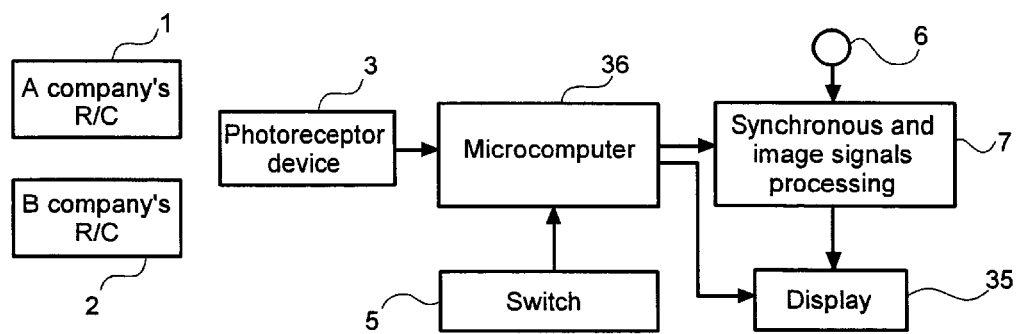
FIG. 7 is a block diagram showing a second embodiment of display according to the present invention.
Figure 8:
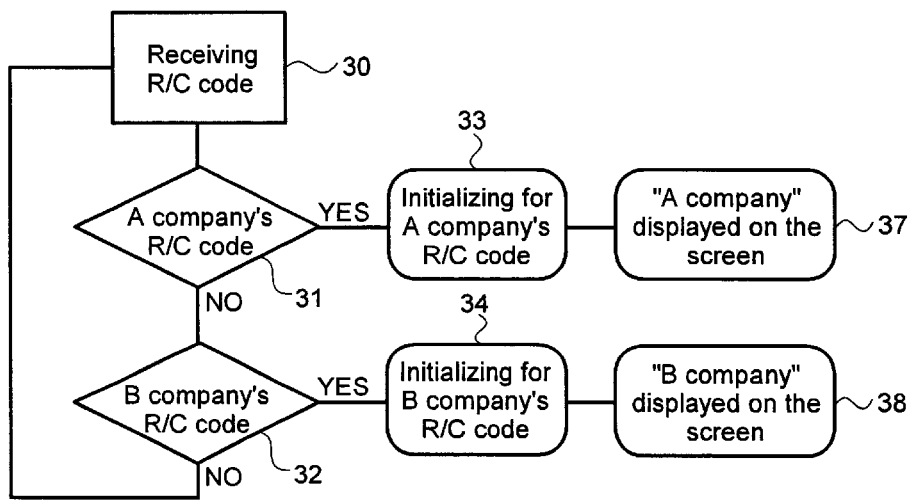
FIG. 8 is a flowchart representing the operation of the second embodiment shown in FIG. 7.

Next, the second embodiment will be described with reference to FIGS. 7 and 8. The second embodiment is obtained by adding a function for explicitly pointing out to the user that code initialization has been established, for example, a function for outputting an OSD (On Screen Display) signal on a display to the first embodiment.

Figure 9:
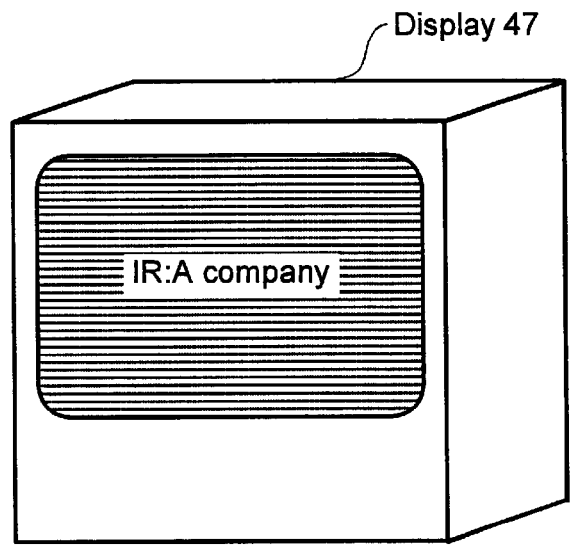
FIG. 9 is a view showing an example of displaying on the display that a code has been initialized.

The basic operation of this embodiment is the same as that of the first embodiment, and the different points will be described. FIG. 7 is a block diagram showing the second embodiment of a display to which the present invention is applied, and components identical to those in FIG. 1 are designated by the identical numerals. This display comprises A company's R/C transmitter 1, B company's R/C transmitter 2, a photoreceptor device 3, a microcomputer 36, a switch 5, a video signal input terminal 6, a synchronous and video signals processing block 7, and a display portion 35. A control signal from the microcomputer 36 is inputted into the signal processing block 7 and the display portion 35. The algorithm in the microcomputer 36 is shown in the flowchart of FIG. 8. An initialization block 33 or 34 initializes so as to correspond to the R/C code of A company or B company, and a display block 37 or 38 initializes the display such as brand "A company" or "B company" of the corresponding remote controller. It is displayed on the display 47 as shown in FIG. 9.

According to this embodiment, the corresponding brand is displayed on the display when the remote controller is switched, whereby it is explicitly pointed out that the remote controller has been switched, thus making it possible to improve the user's usability.

Also, if the determination result of the determination block 32 is NO, the sequence returns to the R/C code receiving block 30. How many times the sequence returned to the R/C code receiving block 30 is counted, and when it amounts to, for example, five times, it may be possible to designate in advance so as to display "Please transmit once more paying attention to the transmission angle" or the like.

Also, if there are plural A company's codes, for example, an ordinary code, an extended code and the like, it may be possible to display on the display likewise which code has been initialized.

Incidentally, in the second embodiment, the present invention has been applied to a display as in the case of the first embodiment, but it may be possible to apply it to equipment equipped with a display portion, for example, devices such as a VTR, a DVD and a CD, each of which is equipped with a liquid crystal display portion.

Figure 10:
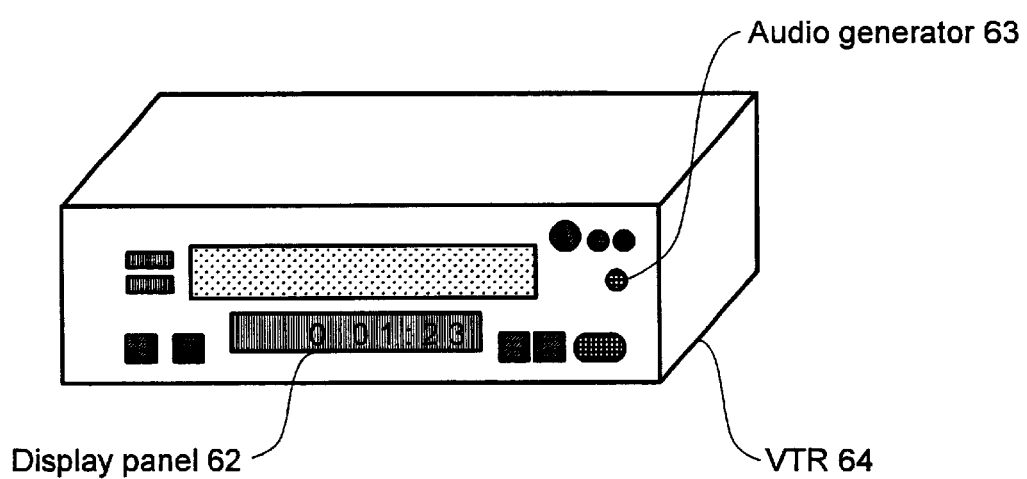
FIG. 10 is a view showing an example of VTR to which the present invention is applied.

Incidentally, it may be possible to point out explicitly to the user by another means as well as display on screen. In the case of, for example, such VTR 64 as shown in FIG. 10, it is advisable to point out explicitly by voice using the audio signal generating unit 63 because the display portion 62 is small. Incidentally, in the case of a device without a display portion, or a device with a small display portion as well as the VTR, it is intelligible if it is notified by voice that code initialization has been made.

Next, the third embodiment will be described. Although the basic operation of this embodiment is the same as that of the first embodiment, the two are different in that a plurality of microcomputers (two microcomputers in this embodiment) are used. In recent years, a display may use a plurality of microcomputers to correspond to the trend toward multifunction.

Figure 11:
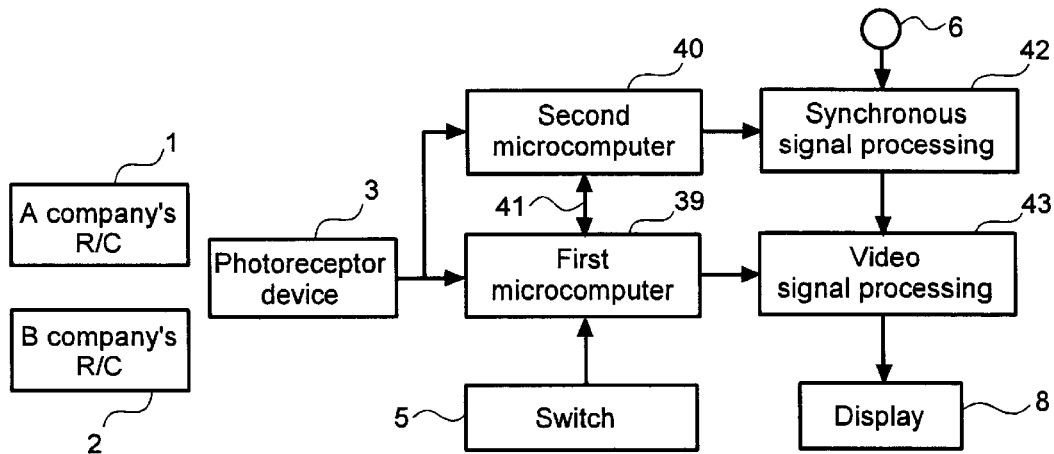
FIG. 11 is a block diagram showing a third embodiment of display according to the present invention.
Figure 12:
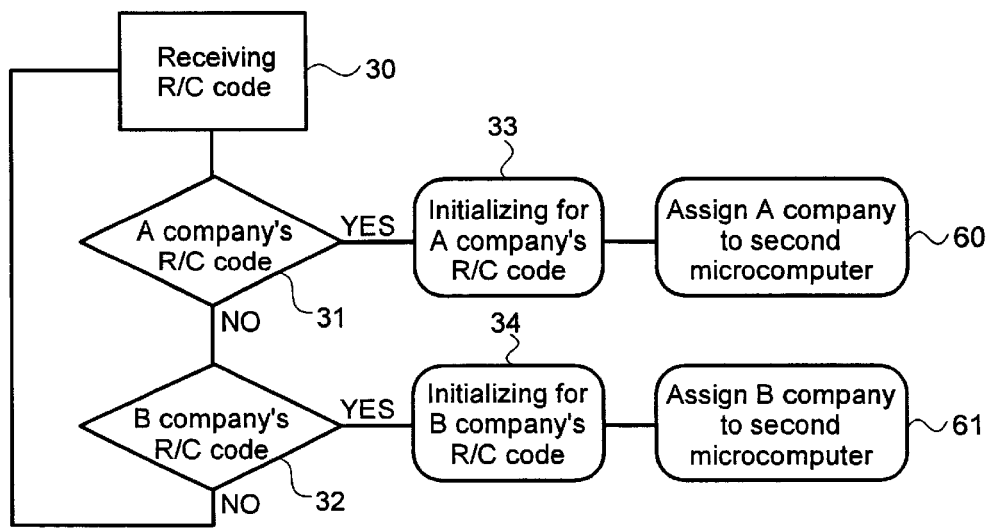
FIG. 12 is a flowchart representing the operation of the third embodiment shown in FIG. 11.

FIG. 11 is a block diagram showing a display to which the present invention is applied. The components identical to those in FIG. 1 are designated by the identical numerals. This display comprises A company's R/C transmitter 1, B company's R/C transmitter 2, a photoreceptor device 3, microcomputers 39 and 40, a switch 5, a video signal input terminal 6, a synchronous signal processing block 42, a video signal processing block 43, a display portion 8, and a bus 41 for transmitting and receiving information between the first microcomputer 39 and the second microcomputer 40. This embodiment shows an example when the second microcomputer 40 is used to control the synchronous signal processing block 42, and the first microcomputer 39 is used to control the video signal processing block 43. Also, the discrimination algorithm in the first microcomputer 39 used in this embodiment is shown in FIG. 12. The output of the photoreceptor device 3 is inputted into the microcomputers 39 and 40, and the first microcomputer 39 to which the switch 5 is connected, discriminates the R/C signal, and transmits a brand discrimination code or the like to the second microcomputer 40 through the bus 41.

According to this embodiment, in the case of sharing the control of plural operations in a display between a plurality of (the first and second) microcomputers, a program for discriminating the R/C signal is stored in any one of the plurality of microcomputers in advance, and this discrimination result is transmitted to the other microcomputer through the bus 41, whereby the same R/C signal as the microcomputer which discriminates the R/C signal can be initialized also in the other microcomputer in question. Namely, a program for discriminating the R/C signal is stored in one microcomputer, whereby it is possible to initialize the R/C signal in the other microcomputers at the same time.

Figure 13:
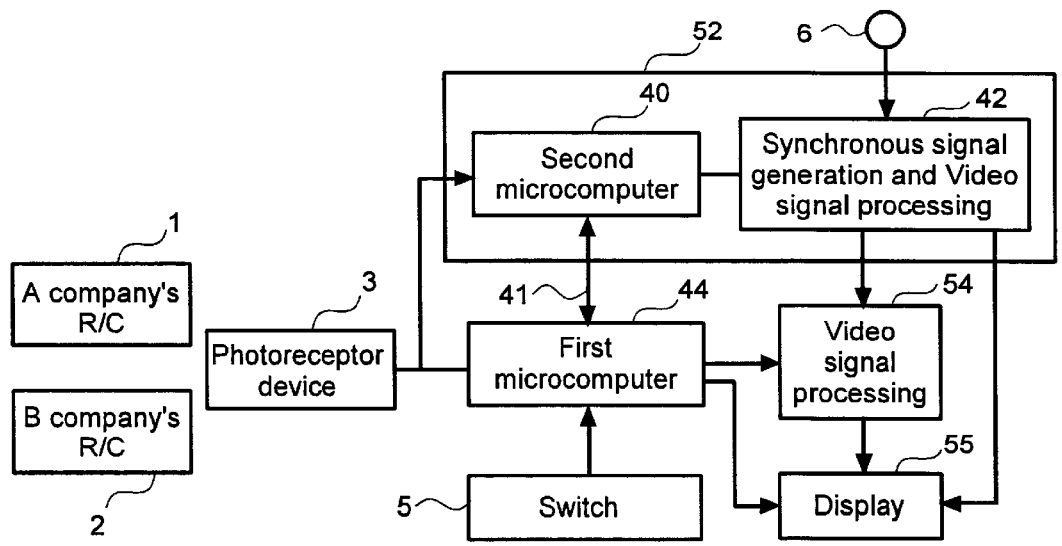
FIG. 13 is a block diagram showing a fourth embodiment of display according to the present invention.
Figure 14:
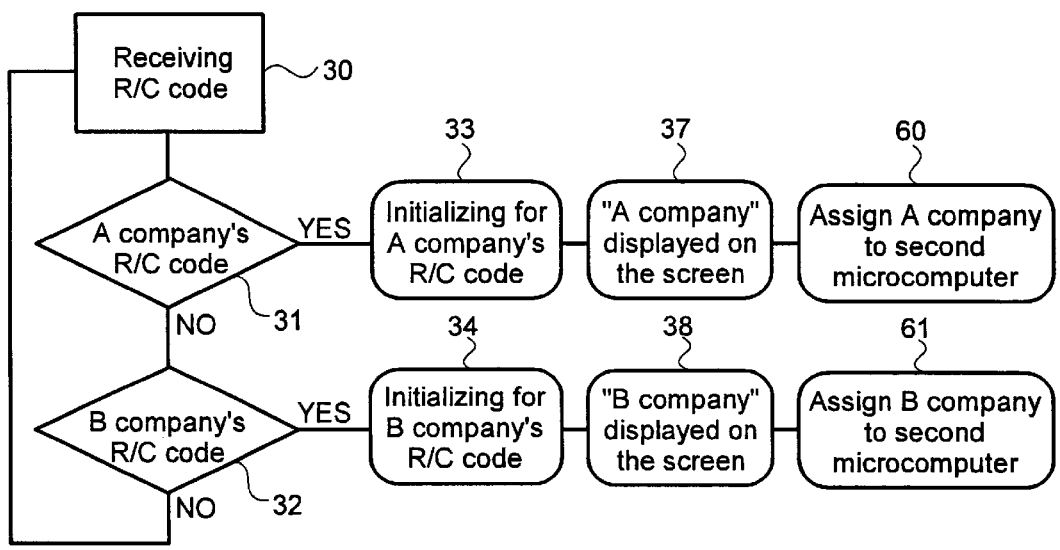
FIG. 14 is a flowchart representing the operation of the fourth embodiment shown in FIG. 13.

Next, the fourth embodiment will be described with reference to FIGS. 13 and 14. The basic operation of this embodiment is the same as that of the third embodiment, and the different points will be described. FIG. 13 is a block diagram showing the fourth embodiment of a display to which the present invention is applied. The components identical to those in FIG. 11 are designated by the identical numerals. This display comprises A company's R/C transmitter 1, B company's R/C transmitter 2, a photoreceptor device 3, microcomputers 44 and 40, a switch 5, a digital signal input terminal 51, a synchronous signal generating and video signal processing block 53, a synchronous signal processing block 54, a display portion 55, and a bus 41. A function block 52 generates analog video signals and synchronous signals from moving picture data compressed digital broadcast by Moving Picture Experts Group(MPEG) method or the like, which has been inputted through the terminal 51. The second microcomputer 40 controls a circuit block 53 which generates a synchronous signal and processes a video signal. A synchronous signal outputted from the circuit block 53 is inputted into the synchronous signal processor 54, and is controlled by the first microcomputer 44. Also, the microcomputer 44 exerts control for correcting the display position of video signals, screen distortion, convergence and the like on the screen of the display portion 55, and control for displaying the OSD and the like from the microcomputer 44 on the screen of the display portion 55. The discrimination algorithm in the first microcomputer 44 is shown in FIG. 14. The output of the photoreceptor device 3 is connected to the microcomputers 44 and 40, and the first microcomputer 44 to which the switch 5 is connected, discriminates the R/C code, and displays "A company", "B company" or the like on the screen of the display portion 55, and at the same time, transmits a brand discrimination code or the like to the second microcomputer 40 through the bus 41.

Incidentally, the switch 5 may be used also as a functional switch on display production lines or as a service adjustment switch used for adjusting screen distortion on the market.

According to the present invention, since it is capable of corresponding to various brands of R/C codes, the operation can be performed in response to plural types of remote controllers while the cost is restrained low.

In addition, it becomes possible to operate even a display set of another brand using the own company's R/C, and since it is capable of coping with service adjustment on the market, the operator's burden can be reduced.

Industrial Applicability

As described above, the present invention is, in equipment which performs remote control using a remote controller, suitable for use in the equipment in which plural types of remote controllers are switched for use, and more particularly when an attempt is made to obtain a display which must correspond to plural types of remote controllers.

What is claimed is:

1. A display comprising:
    a photoreceptor device that receives remote control signals from first and second remote controllers and converts them into electric signals;
    a control circuit that executes commands encoded in the remote control signals;
    a switch connected to the control circuit that provides a first control mode in which control functions are performed in response to remote control signals from the first remote controller and a second control mode in which control functions are performed in response to remote control signals from the second remote controller; and
    when the switch is in a first position determines which of the first and second remote controllers has transmitted remote control signals, and initializes in either the first or second control mode, according to the determination, and
    wherein when the switch selects the first control mode or the second control mode, information for identifying the remote controller corresponding to the selected mode is displayed,
    wherein the control circuit includes first and second microcomputers, the first microcomputer judging which of the remote controllers has transmitted and initializing itself and the second microcomputer in the appropriate control mode.

2. The display as in claim 1 wherein the control circuit executes the operation mode selection based on a discrimination signal designating the type of remote controller among the remote control signals.

3. The display as in claim 2 wherein the discrimination signal designates a source of the remote controller.

4. The display as in claim 1 further including a circuit for displaying on the screen the result of the determination which the remote controllers has transmitted.

5. The display as in claim 1 wherein the first microcomputer controls an image signal processor for processing input image signals, and the second microcomputer controls a synchronous signal processor which processes synchronous input signals, and the first and second microcomputers are interconnected to communicate which of the remote controllers has transmitted.

6. A display as in claim 1 wherein:
    the first microcomputer performs control functions for convergence correction and displays on the screen which of the remote controllers has transmitted,
    the second microcomputer converts digitized video signals into analog video signals, and
    the first and second microcomputers are interconnected.

7. A display as in claim 1 wherein the switch is connected to the first microcomputer.

8. A display as in claim 1 further including a display screen for displaying the information for operation mode initialization to be performed by the initializing circuit.

* * * * *